US009865680B2

(12) United States Patent
Okumura et al.

(10) Patent No.: US 9,865,680 B2
(45) Date of Patent: Jan. 9, 2018

(54) SEMICONDUCTOR DEVICE WITH PERIPHERAL VOID SPACE AND METHOD OF MAKING THE SAME

(71) Applicant: KABUSHIKI KAISHA TOSHIBA, Tokyo (JP)

(72) Inventors: Hideki Okumura, Nonoichi Ishikawa (JP); Takuya Yamaguchi, Nomi Ishikawa (JP); Masanobu Tsuchitani, Kanazawa Ishikawa (JP); Sadayuki Jimbo, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/250,847

(22) Filed: Aug. 29, 2016

(65) Prior Publication Data

US 2017/0263703 A1 Sep. 14, 2017

(30) Foreign Application Priority Data

Mar. 14, 2016 (JP) ................................ 2016-049985

(51) Int. Cl.
*H01L 29/06* (2006.01)
*H01L 29/861* (2006.01)
(Continued)

(52) U.S. Cl.
CPC ........ *H01L 29/0661* (2013.01); *H01L 21/308* (2013.01); *H01L 21/3065* (2013.01);
(Continued)

(58) Field of Classification Search
CPC ............ H01L 29/0661; H01L 29/7802; H01L 29/7811; H01L 29/0649
See application file for complete search history.

(56) References Cited

U.S. PATENT DOCUMENTS 6,359,308 B1 3/2002 Hijzen et al.
6,870,201 B1 3/2005 Deboy et al.
(Continued)

FOREIGN PATENT DOCUMENTS

JP 2001522145 A 11/2001
JP 2003505886 A 2/2003
(Continued)

*Primary Examiner* — Tucker J Wright
(74) *Attorney, Agent, or Firm* — Patterson & Sheridan, LLP

(57) ABSTRACT

A semiconductor device includes a first semiconductor region of a first conductivity type on a first electrode and a second semiconductor region of the first conductivity type on a central portion of the first semiconductor region. The second region has a carrier concentration less than a carrier concentration of the first region. A third semiconductor region of a second conductivity type is on the second semiconductor region. A first insulating portion covers a peripheral surface of the second semiconductor region and a peripheral surface of the third semiconductor region. A second insulating portion is spaced from the first insulating portion in a lateral direction. A void space is between the first and second insulating portions. A third insulating portion is on the third semiconductor region and spans and covers the void space. A second electrode is on the third semiconductor region and the third insulating portion.

20 Claims, 14 Drawing Sheets

(51) Int. Cl.
*H01L 29/78* (2006.01)
*H01L 21/3065* (2006.01)
*H01L 21/308* (2006.01)
*H01L 29/66* (2006.01)

(52) U.S. Cl.
CPC .... *H01L 29/6609* (2013.01); *H01L 29/66712* (2013.01); *H01L 29/7802* (2013.01); *H01L 29/861* (2013.01)

(56) References Cited

U.S. PATENT DOCUMENTS

| | | | | |
|---|---|---|---|---|
| 7,038,289 | B2 * | 5/2006 | Marty | H01L 21/764 257/501 |
| 7,564,107 | B2 | 7/2009 | Yanagisawa et al. | |
| 2004/0147093 | A1 * | 7/2004 | Marty | H01L 21/764 438/442 |
| 2006/0017096 | A1 * | 1/2006 | Yanagisawa | H01L 29/0661 257/329 |
| 2008/0164516 | A1 * | 7/2008 | Darwish | H01L 29/0649 257/329 |
| 2016/0276430 | A1 | 9/2016 | Okumura et al. | |

FOREIGN PATENT DOCUMENTS

| | | | |
|---|---|---|---|
| JP | 3875245 | B2 | 1/2007 |
| JP | 2011243671 | A | 12/2011 |
| JP | 2016171267 | A | 9/2016 |

* cited by examiner

IL4
IL2
IL1
OP2
12
11
4
3
p
p+
n−
n+
T1
Z
X
Y

SEMICONDUCTOR DEVICE WITH PERIPHERAL VOID SPACE AND METHOD OF MAKING THE SAME

CROSS-REFERENCE TO RELATED APPLICATION

This application is based upon and claims the benefit of priority from Japanese Patent Application No. 2016-049985, filed Mar. 14, 2016, the entire contents of which are incorporated herein by reference.

FIELD

Embodiments described herein relate generally to a semiconductor device.

BACKGROUND

Semiconductor devices such as a diode, a metal oxide semiconductor field effect transistor (MOSFET), and an insulated gate bipolar transistor (IGBT) are used, for example, for power conversion applications. It is desirable that these semiconductor devices have a small size yet still handle large power loads.

DETAILED DESCRIPTION

Figure 1:
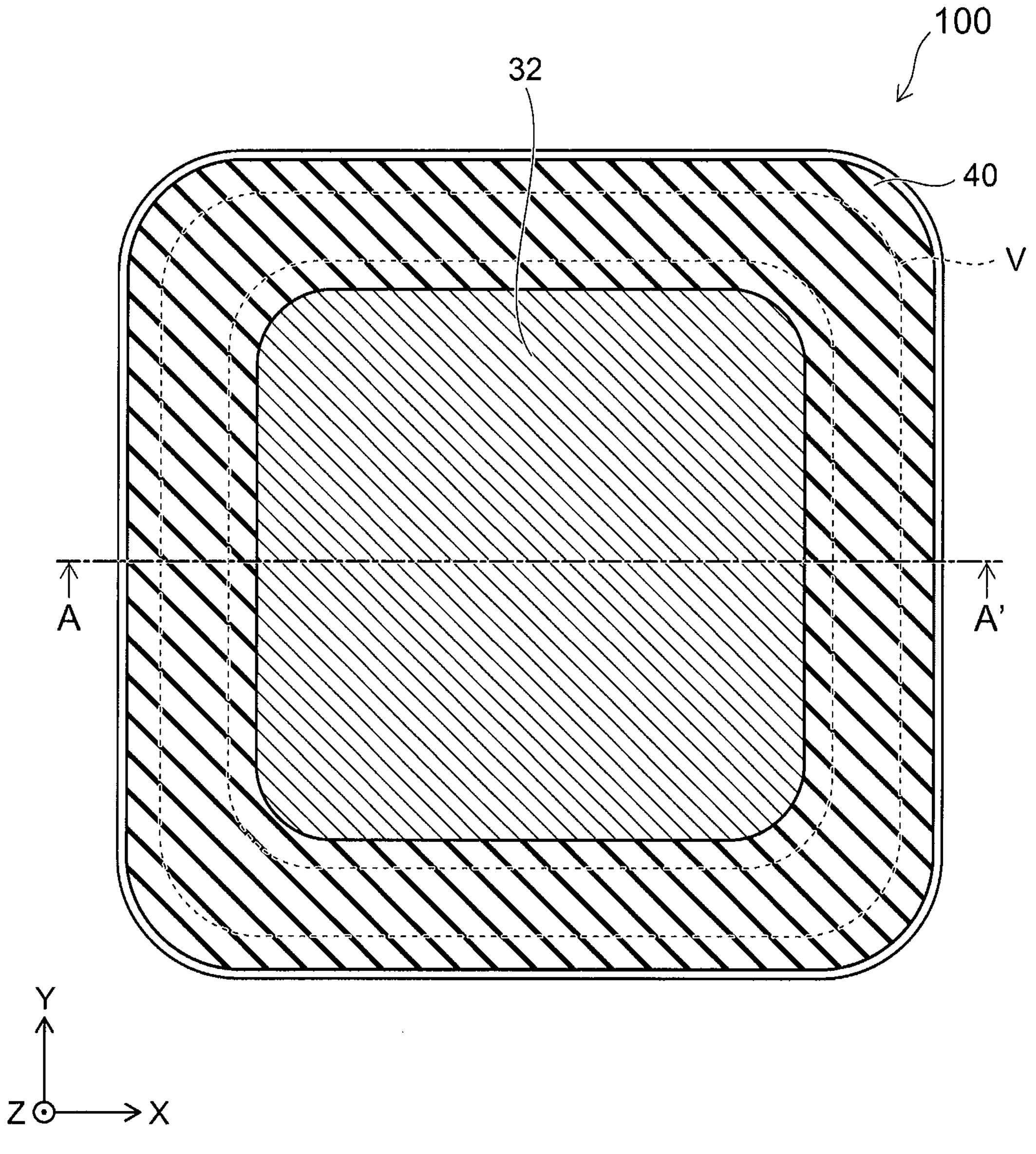
FIG. 1 is a plan view illustrating a semiconductor device according to a first embodiment.

In general, according to one embodiment, a semiconductor device includes a first electrode having a first surface. A first semiconductor region of a first conductivity type is on the first surface of the first electrode. A second semiconductor region of the first conductivity type is on a central portion of the first semiconductor region, and has a first conductivity type carrier concentration that is less than a first conductivity type carrier concentration of the first semiconductor region. A third semiconductor region of a second conductivity type is on the second semiconductor region. A first insulating portion covers an outer peripheral surface of the second semiconductor region and an outer peripheral surface of the third semiconductor region. A second insulating portion is spaced from the first insulating portion in a lateral direction parallel to the first surface and extends outwardly of the central portion of the first semiconductor region. A void space (void) is between the first and second insulating portions in the lateral direction. A third insulating portion is on the third semiconductor region and spans across the void space in the lateral direction so as to cover the void space. A second electrode is on the third semiconductor region and the third insulating portion, and is electrically connected to the third semiconductor region.

Hereinafter, example embodiments will be described with reference to the accompanying drawings.

Furthermore, the drawings are schematic and/or conceptual, and the depicted relationship between thicknesses and widths of elements, size ratios between the elements, and the like are not always the same as the actual relationship, actual size ratios, and the like in an actual device. In addition, even for the same element, dimensions or ratios may be illustrated differently depending on the drawings.

In addition, in this specification and the drawings, the same reference numeral will be given to the same element once already described, and detailed description of these repeated elements may be appropriately omitted.

In the description of respective embodiments, an XYZ orthogonal coordinate system is used for purposes of explanation. Two directions which are parallel to a plane including $n^-$ type semiconductor region 2 and $n^-$ type semiconductor region 5 and are perpendicular to each other, are referred to as an X direction and a Y direction. A direction, which extends from cathode electrode 31 towards anode electrode 32 and is orthogonal to the plane parallel to the X direction and Y direction is referred to as a Z direction.

In the following description, notations of "$n^+$", "$n^-$", "$p^+$", and "$p^-$" represent relative magnitudes of impurity concentrations for the respective conductivity types. That is, a notation attached with "+" represents that an impurity concentration is relatively higher in comparison to any notation to which "+" is not attached, and a notation attached with "−" represents that an impurity concentration is relatively lower in comparison to any notation to which "−" is not attached.

In the following example embodiments, the embodiments may also be implemented by inverting p type and n type of respective semiconductor regions.

First Embodiment

Figure 2:
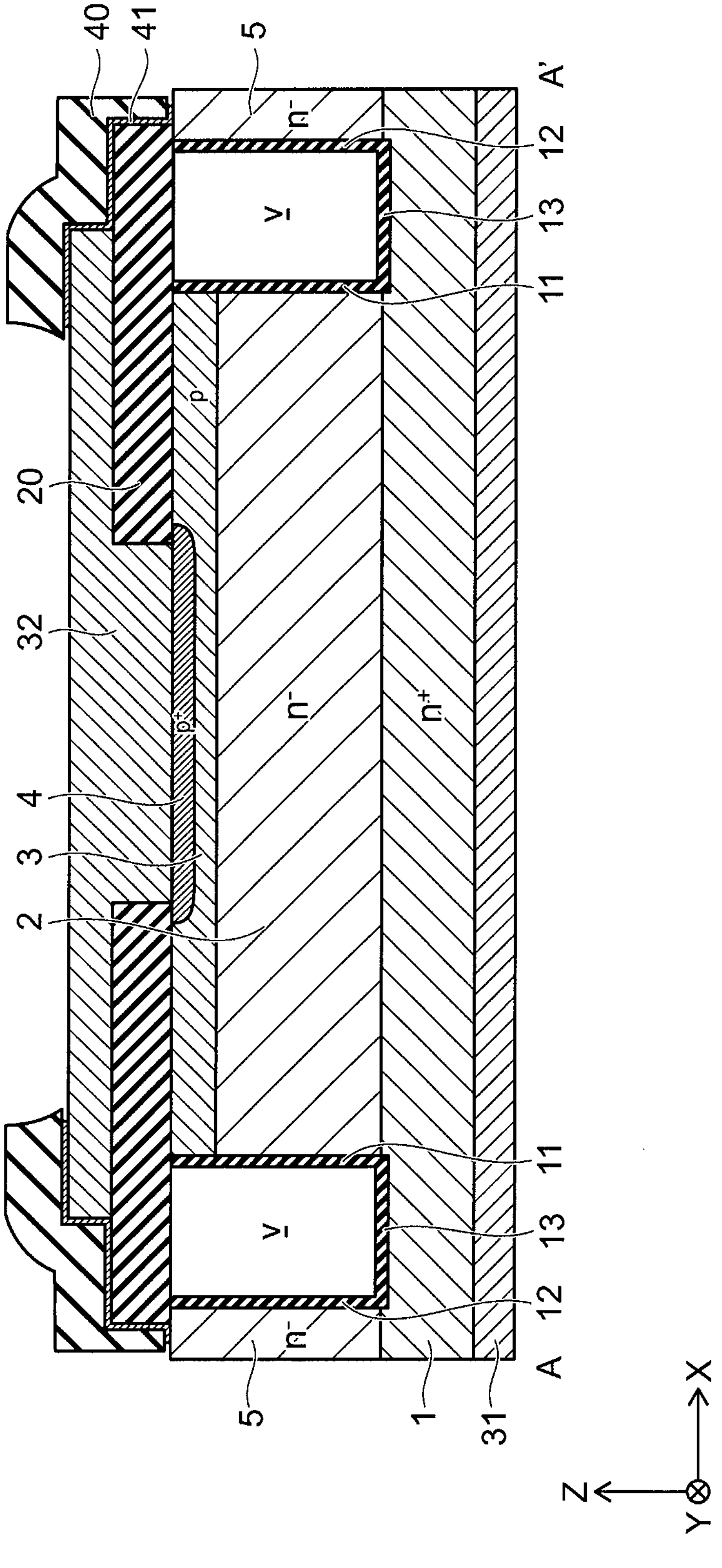
FIG. 2 is a cross-sectional view taken along line A-A' in FIG. 1.

FIG. 1 is a plan view illustrating a semiconductor device 100 according to the first embodiment. FIG. 2 is a cross-sectional view taken along line A-A' in FIG. 1. In FIG. 1, outer edges of a void V are indicated by a broken line.

The semiconductor device 100 is a diode. As illustrated in FIG. 1 and FIG. 2, the semiconductor device 100 includes an $n^+$ type (first conductivity type) semiconductor region 1 (first semiconductor region), an $n^-$ type semiconductor region 2 (second semiconductor region), a p type (second conductivity type) semiconductor region 3 (third semiconductor region), a $p^+$ type semiconductor region 4, an $n^-$ type semiconductor region 5 (semiconductor portion), an insulating portion 11 (first insulating portion), an insulating portion 12 (second insulating portion), an insulating portion 13, an insulating portion 20 (third insulating portion), a cathode electrode 31 (first electrode), an anode electrode 32 (second electrode), an insulating portion 40 (fourth insulating portion), a conductive layer 41, and a void V.

As illustrated in FIG. 1, the anode electrode 32 is provided on an upper surface of the semiconductor device 100. The insulating portion 40 is provided at the periphery of the anode electrode 32. The void V is provided in an annular shape to surround a central portion of the semiconductor device 100.

As illustrated in FIG. 2, the cathode electrode 31 is provided on a lower surface of the semiconductor device 100. The $n^+$ type semiconductor region 1 is provided on the cathode electrode 31, and is electrically connected to the cathode electrode 31. The $n^-$ type semiconductor region 2 is provided on the $n^+$ type semiconductor region 1. The p type semiconductor region 3 is provided on the $n^-$ type semiconductor region 2. The $p^+$ type semiconductor region 4 is selectively provided on the p type semiconductor region 3.

The insulating portion 11 is provided at the periphery of the $n^-$ type semiconductor region 2 and the p type semiconductor region 3. That is, the insulating portion 11 is in contact with an outer edge of the $n^-$ type semiconductor region 2 and an outer edge of the p type semiconductor region 3. The insulating portion 12 is provided at the periphery of the insulating portion 11 and is spaced away from the insulating portion 11 in a direction further from the central portion. The void V is formed between the insulating portion 11 and the insulating portion 12. The insulating portion 13 is provided at a portion where the $n^+$ type semiconductor region 1 faces the void V. The $n^-$ type semiconductor region 5 is provided at the periphery of the insulating portion 12. The insulating portion 12 is in contact with the $n^-$ type semiconductor region 5.

The anode electrode 32 is provided on the $p^+$ type semiconductor region 4, and is electrically connected to the $p^+$ type semiconductor region 4. The insulating portion 20 is provided at the periphery of the anode electrode 32, and is located on an outer periphery of the p type semiconductor region 3, on an outer periphery of the $p^+$ type semiconductor region 4, and on the $n^-$ type semiconductor region 5. In addition, the insulating portion 20 covers the void V. That is, the void V is a space surrounded by the insulating portions 11 to 13 and the insulating portion 20.

A part of the anode electrode 32 is located on the insulating portion 20 and is above the void V or at least a part of the void V. The insulating portion 40 is provided at the periphery of the anode electrode 32 and covers an outer periphery of the insulating portion 20 and an outer periphery of the anode electrode 32.

The conductive layer 41 is provided between the $n^-$ type semiconductor region 5, the insulating portion 20, and the anode electrode 32 on one side, and the insulating portion 40 on the other side of the conductive layer. In addition, the conductive layer 41 is electrically connected to the $n^-$ type semiconductor region 5 and the anode electrode 32.

Furthermore, it should be noted, the void V is not limited to the particular example shape and position shown in FIG. 2, but may instead be provided in a part of the $n^-$ type semiconductor region 2 and at the periphery of the p type semiconductor region 3. That is, a part of the $n^-$ type semiconductor region 2 may be surrounded by the void V, and another part of the $n^-$ type semiconductor region 2 may be provided beyond the periphery of the void V. The void V may also be formed to be deeper than the example illustrated in FIG. 2, so as to surround a part of the $n^+$ type semiconductor region 1, for example.

Here, description will be given of examples of the constituent materials of the respective elements.

The $n^+$ type semiconductor region 1, the $n^-$ type semiconductor region 2, the p type semiconductor region 3, and the $p^+$ type semiconductor region 4 may comprise silicon, silicon carbide, gallium nitride, or gallium arsenide as a semiconductor material. When using silicon as the semiconductor material, arsenic, phosphorous, or antimony may be used as an n type impurity. Boron may be used as a p type impurity.

The insulating portions 11 to 13 and the insulating portion 20 may comprise an insulating material such as silicon oxide or silicon nitride.

The cathode electrode 31 and the anode electrode 32 comprise a metal such as nickel or aluminum.

The insulating portion 40 contains an insulating resin such as polyimide.

The conductivity layer 41 can be a layer such as a semi-insulating silicon nitride layer or a semi-insulating polycrystal silicon layer which have a high electrical resistance. The electrical resistance in the conductive layer 41 is higher than electrical resistance in the $n^-$ type semiconductor region 5 and the anode electrode 32, but is lower than the insulating portion 20.

Next, description will be given of an example of a method of manufacturing the semiconductor device 100 according to the first embodiment.

FIGS. 3A, 3B, and 5A to 6B are cross-sectional views illustrating aspects of an example of the method of manufacturing the semiconductor device 100 according to the first embodiment.

Figure 4:
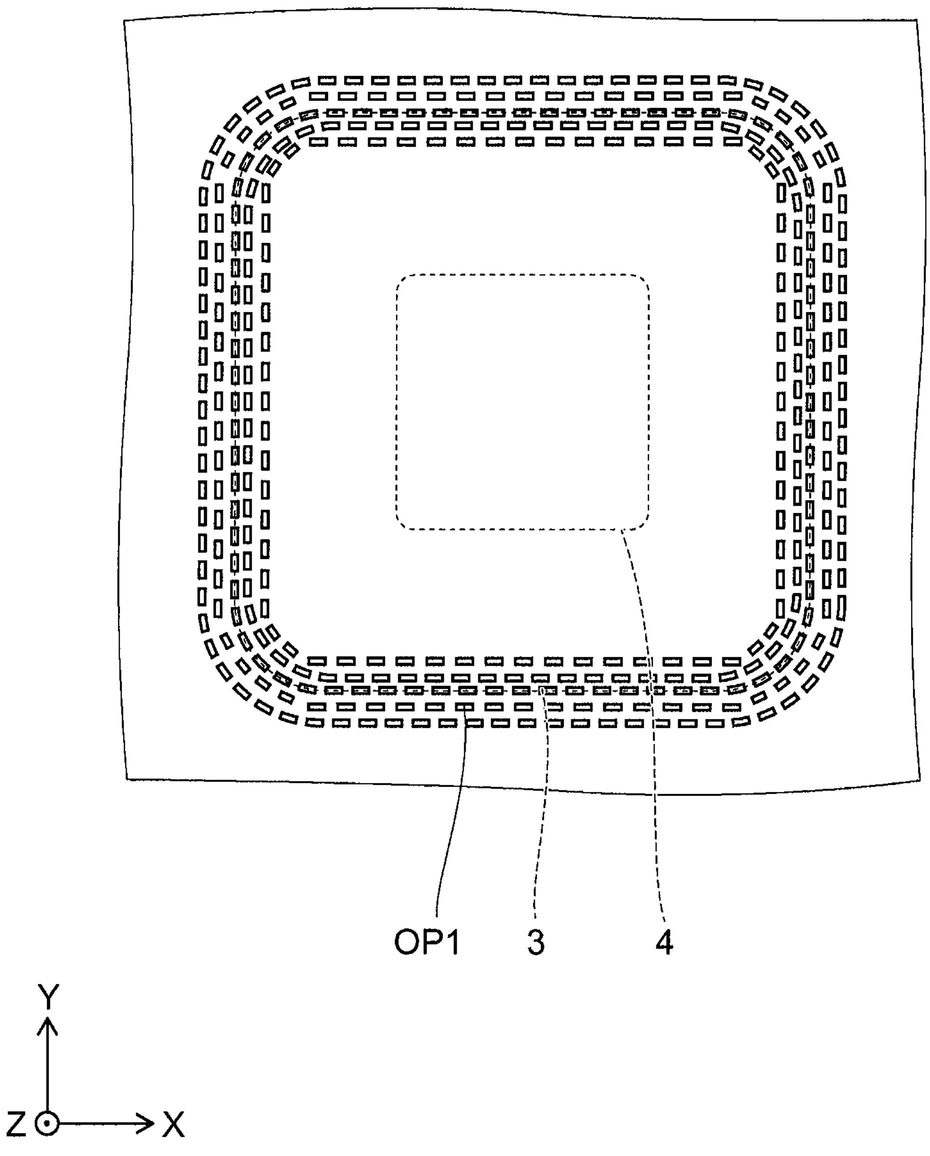
FIG. 4 is a plan view illustrating aspects of the example of the method of manufacturing the semiconductor device according to the first embodiment.

FIG. 4 is a plan view illustrating the example of the method of manufacturing the semiconductor device 100 according to the first embodiment.

Figure 3A:
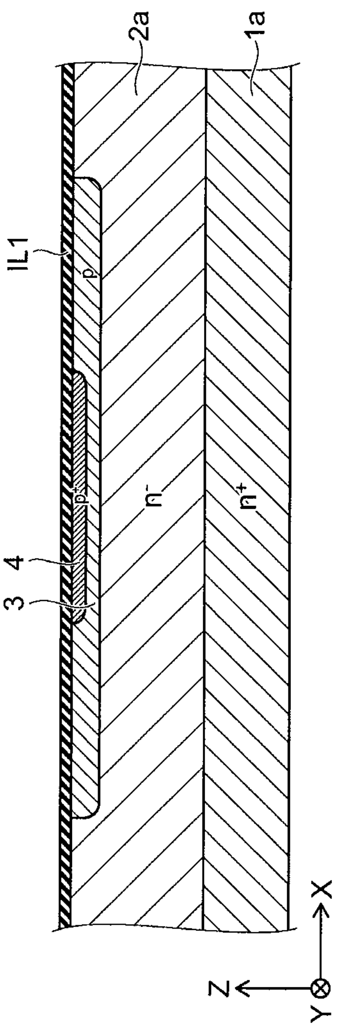
FIGS. 3A and 3B are cross-sectional views illustrating aspects of an example process of a method of manufacturing the semiconductor device according to the first embodiment.

First, a semiconductor substrate including an $n^+$ type semiconductor layer 1*a* and an $n^-$ type semiconductor layer 2*a* is prepared or obtained. Next, p type impurities are injected into a surface of the $n^-$ type semiconductor layer 2*a* by ion implantation. Subsequently, the semiconductor substrate is thermally oxidized. According to this process, an insulating layer IL1 is formed in the surface of the $n^-$ type semiconductor layer 2*a*, and the p type semiconductor region 3 that was formed in the surface of the $n^-$ type semiconductor layer 2*a*. Then, p type impurities are injected into the surface of the p type semiconductor region 3 by ion implantation to form the $p^+$ type semiconductor region 4 as illustrated in FIG. 3A.

Figure 3B:
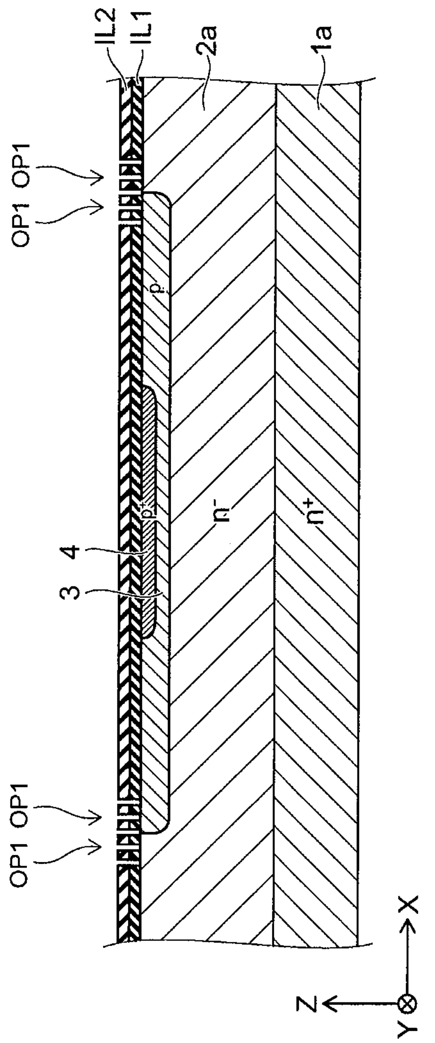

Next, an insulating layer IL2 is formed on the insulating layer IL1 by using a chemical vapor deposition (CVD) method. Subsequently, the insulating layers IL1 and IL2 are patterned. According to this process, as illustrated in FIG. 3B, a plurality of openings OP1 are formed in the insulating layers IL1 and IL2.

After this patterning, the plurality of openings OP1 are arranged around the periphery of the p type semiconductor region 3 and the $p^+$ type semiconductor region 4, as illustrated in FIG. 4. The plurality of openings OP1 reduce the possibility that that the insulating layers IL1 and IL2 will collapse when the trench T1 is later formed As an example, the openings OP1 are formed to have a rectangular shape in plan view and a short side the rectangular shape is 3 μm or less.

Next, a portion of the $n^-$ type semiconductor layer 2*a* is removed through the plurality of openings OP1. At this time, for example, anisotropic etching such as a reactive ion etching (RIE) method and isotropic etching such as a chemical dry etching (CDE) method are alternately and repeatedly performed. According to this process, a part of the semiconductor region directly underneath the insulating layers IL1 and IL2 is etched in addition to the part of semiconductor region exposed by the openings OP1. As a result, a single large trench T1 is formed below the plurality of openings OP1. The trench T1 is formed in an annular shape at the periphery of a part of the $n^-$ type semiconductor layer 2*a* and at the periphery of the p type semiconductor region 3. At this time, a part of the $n^-$ type semiconductor layer 2*a*, which is located beyond the periphery of the trench T1 can be considered to correspond to the $n^-$ type semiconductor region 5 depicted in FIG. 2.

Figure 5A:
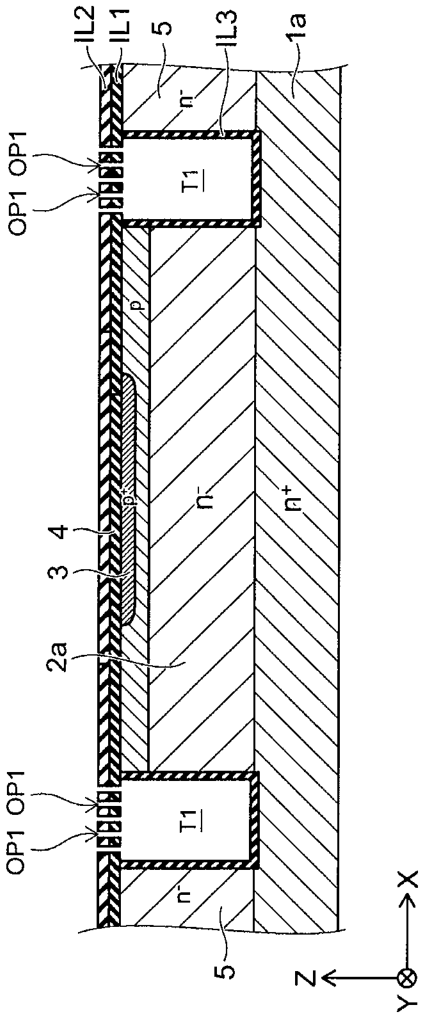
FIGS. 5A and 5B are cross-sectional views illustrating aspects of the method of manufacturing the semiconductor device according to the first embodiment.

Next, the semiconductor substrate is thermally oxidized. According to this process, as illustrated in FIG. 5A, an insulating layer IL3 is formed on an inner wall of the trench T1. Respective portions of the insulating layer IL3 correspond to the insulating portions 11 to 13 that were depicted in FIG. 2.

Next, an insulating layer IL4, which serves to close the openings OP1, is formed on the insulating layers IL1 and IL2 by using a CVD method. The insulating layer IL4 can be formed in such a manner that the trench T1 is not filled. According to this process, the void V is formed.

In a later process step, when the semiconductor substrate is heated, a pressure may be applied to the semiconductor substrate due to thermal expansion of gas trapped in the void V, and the semiconductor substrate could thus be damaged. In order to reduce the pressure that might be applied to the semiconductor substrate by this mechanism, the insulating layer IL4 may be formed in a reduced-pressure atmosphere. In this case, the pressure inside the void V after closure of openings OP1 may be lower than the atmospheric pressure.

Figure 5B:
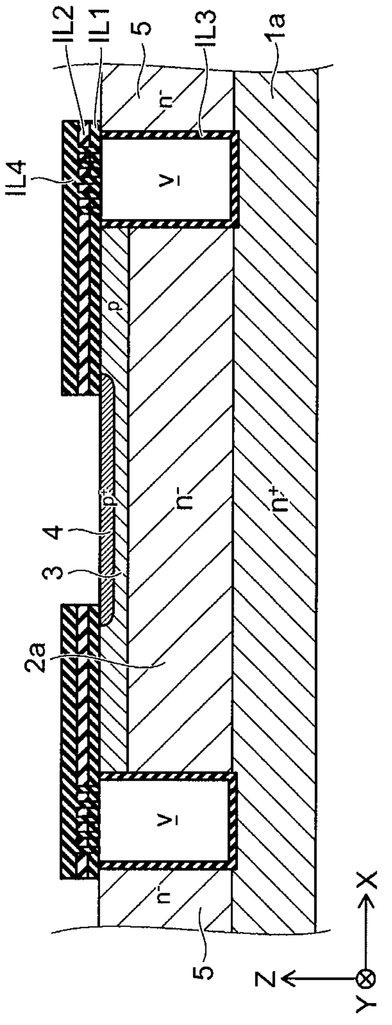

Subsequently, a part of each of the insulating layers IL1, IL2, and IL4 is removed to expose an upper surface of the $p^+$ type semiconductor region 4 and an upper surface of the $n^-$ type semiconductor region 5, as illustrated in FIG. 5B.

Next, a metal layer, which covers the insulating layer IL4, is formed, and this metal layer is patterned to form the anode electrode 32. At this time, the insulating layers IL1, IL2, and IL4 can be patterned to correspond to the insulating portion 20.

Figure 6A:
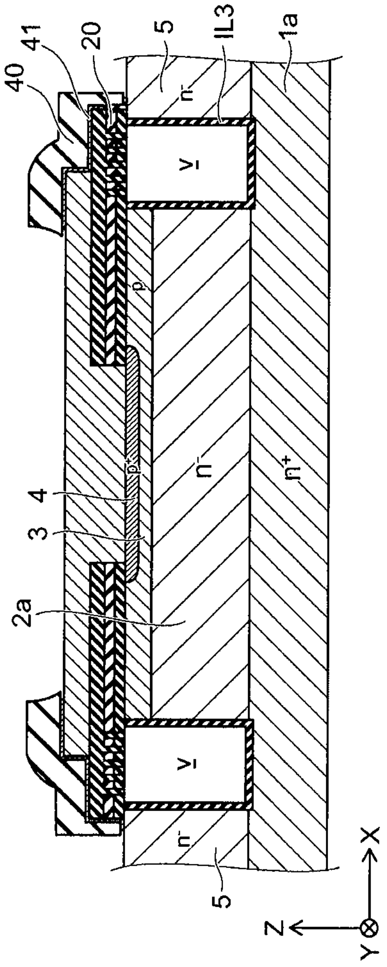
FIGS. 6A and 6B are cross-sectional views illustrating aspects of the method of manufacturing the semiconductor device according to the first embodiment.

Subsequently, the conductive layer 41 is formed at an outer periphery of the anode electrode 32, and the insulating portion 40 is formed on the conductive layer 41. A state at this point is illustrated in FIG. 6A.

Figure 6B:
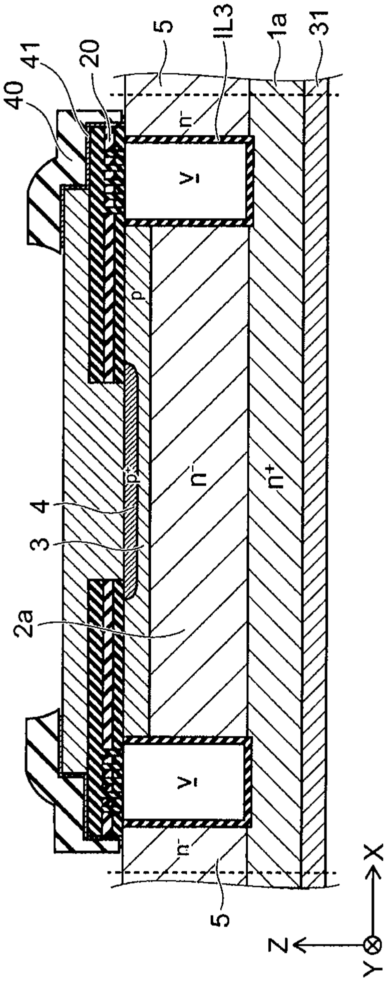

Next, a rear surface of the $n^+$ type semiconductor layer 1*a* is ground until the $n^+$ type semiconductor layer 1*a* has a predetermined thickness. Subsequently, as illustrated in FIG. 6B, the cathode electrode 31 is formed on the rear surface of the $n^+$ type semiconductor layer 1*a* which has been ground. Then, the semiconductor substrate can be diced at a position indicated by a broken line in FIG. 6B to obtain the semiconductor device 100 illustrated in FIGS. 1 and 2.

Here, the semiconductor substrate is diced to leave a part of the $n^-$ type semiconductor region 5 in the resulting semiconductor device 100. According to this dicing, as illustrated in FIG. 2, the semiconductor device 100 is provided with the $n^-$ type semiconductor region 5 at the periphery of the insulating portion 12.

Furthermore, the $n^-$ type semiconductor region 5 may be selectively etched by using the RIE method or the like to leave only the insulating layer IL3 rather than the $n^-$ type semiconductor region 5 in the final device. In this case, a semiconductor device in which only the insulating portion 12 is left at the periphery of the void V would be obtained as possible variation of the semiconductor device 100 depicted in the FIG. 2.

In addition, in the above-described manufacturing method, the insulating layer IL1 is formed through the thermal oxidation of the semiconductor substrate, and the insulating layer IL3 is formed by the CVD method. According to this, the insulating layer IL1 will typically be denser than the insulating layer IL3.

Accordingly, it is possible to confirm a position of the openings OP1 formed in the insulating layer IL1, and the insulating layer IL3 formed in the openings OP1 by observing a cross-section of the insulating portion 20.

The semiconductor device 100 can also be manufactured by using a method illustrated in FIGS. 7A to 8B instead of the method illustrated in FIGS. 3A to 6B.

FIGS. 7A to 8B are cross-sectional views illustrating another example of the method of manufacturing the semiconductor device 100 according to the first embodiment.

Figure 7A:
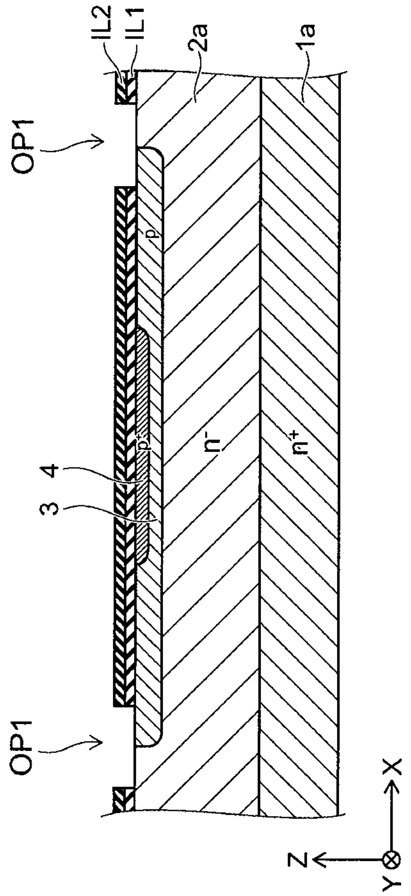
FIGS. 7A and 7B are cross-sectional views illustrating aspects of a different example process of the method of manufacturing the semiconductor device according to the first embodiment.
Figure 7B:
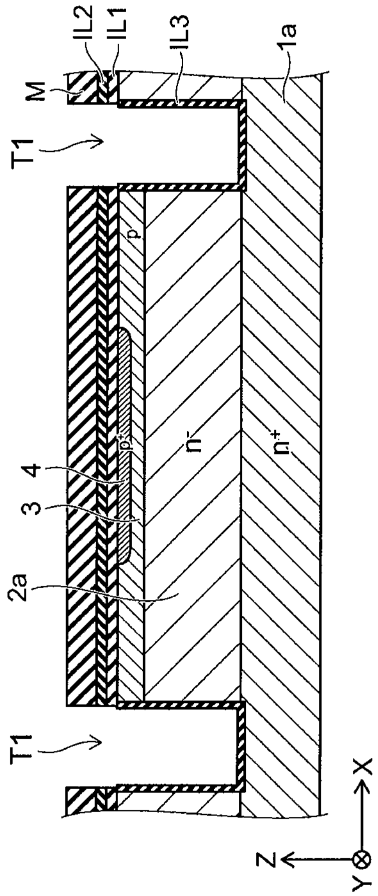

First, as was also the case with the process illustrated in FIG. 3A, the p type semiconductor region 3, the $p^+$ type semiconductor region 4, and the insulating layer IL1 are formed in the surface of the $n^-$ type semiconductor layer 2*a*. Next, the insulating layer IL2 and a photoresist layer are formed are formed on the insulating layer IL1. Subsequently, the insulating layer IL1, the insulating layer IL2, and the photoresist layer M are patterned to form an opening OP1 in the layers as illustrated in FIG. 7A and FIG. 7B. The opening OP1 is formed in an annular shape at the periphery of the p type semiconductor region 3 and the $p^+$ type semiconductor region 4. In addition, a width of the opening OP1 is set to be approximately the same as a width of the void V to be formed in a later process.

Next, a part of the $n^-$ type semiconductor layer 2*a* and a part of the p type semiconductor region 3 are removed through the opening OP1 by anisotropic etching to form a trench T1 (first trench). Subsequently, the semiconductor substrate is thermally oxidized to form the insulating layer IL3 in an inner wall of the trench T1 as illustrated in FIG. 7B.

Figure 8A:
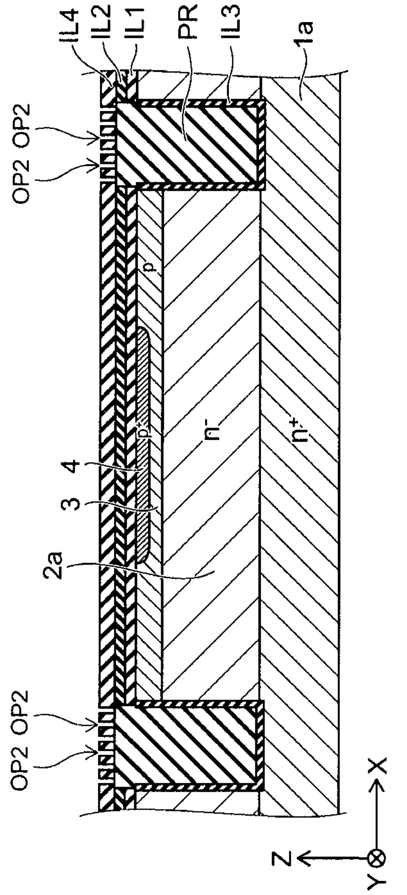
FIGS. 8A and 8B are cross-sectional views illustrating the other aspects of the different example process of the method of manufacturing the semiconductor device according to the first embodiment.
Figure 8B:
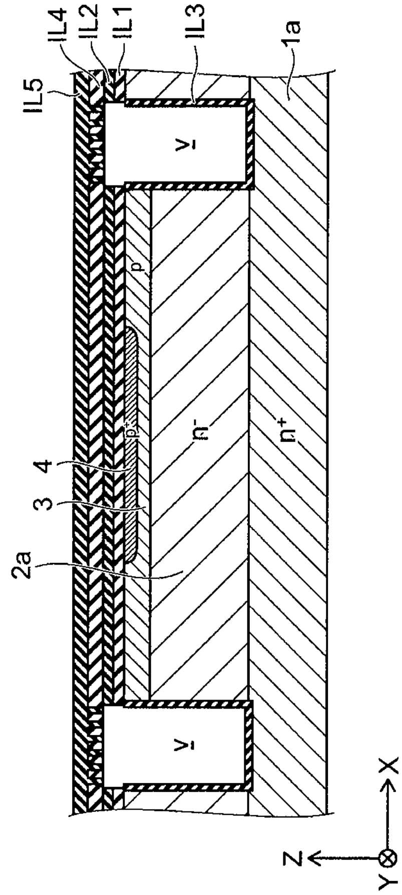

Next, a photoresist PR as a sacrificial layer is formed inside of the trench T1. Subsequently, an insulating layer IL4, which covers the insulating layer IL2 and the photoresist PR, is formed by using a CVD method. Subsequently, a plurality of openings OP2 are formed in the insulating layer IL3 to expose a part of the photoresist PR as illustrated in FIG. 8A.

Furthermore, for example, the openings OP2 are formed to be arranged in a circumferential direction as is also the case with the openings OP1 illustrated in FIG. 4. In addition, organic material other than a photoresist PR may be used in this process—that is, the photoresist PR may be replaced with an organic material that lacks photolithographic imaging capabilities or photo-responsive characteristics.

Next, the photoresist (organic material) PR is removed by ashing using oxygen plasma or an ozone gas passing through the openings OP2. According to this, the trench T1, which was formed in the previous process, is cleared again. Subsequently, an insulating layer IL5, which closes (fills or covers) the opening OP2, is formed by using a CVD method. The insulating layer IL5 does not to fill the trench T1 and thus, the void V is enclosed.

Then, the same processes as illustrated in FIG. 5B to FIG. 6B are performed to obtain the semiconductor device 100.

Figure 9A:
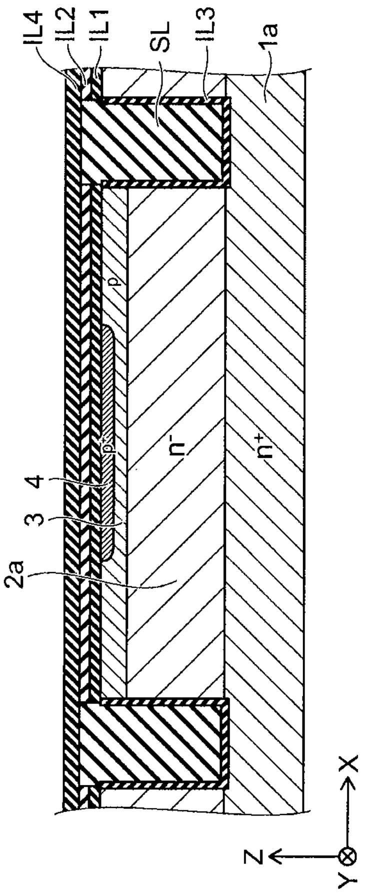
FIGS. 9A and 9B are cross-sectional views illustrating aspects of still another example of a process of the method of manufacturing the semiconductor device according to the first embodiment.
Figure 9B:
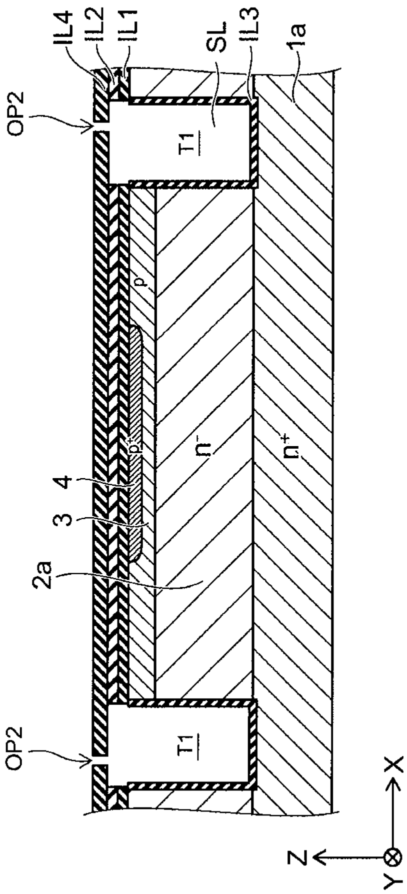

In another alternative method, semiconductor device 100 can be manufactured by using the method illustrated in FIGS. 9A and 9B.

FIGS. 9A and 9B are process cross-sectional views illustrating still another example of the method of manufacturing the semiconductor device 100 according to the first embodiment.

First, the same processes as illustrated in FIG. 7A and FIG. 7B are performed to form the trench T1 and the insulating layer IL3 in the semiconductor substrate. Next, a sacrificing layer SL is formed inside of the trench T1. The sacrificing layer SL is a material which is a solid at room temperature, but relatively easily becomes a liquid or a gas when being heated. Examples of the material include boric acid ($BH_3O_3$). Boric acid is a solid at room temperature, and becomes a liquid at a temperature higher than approximately 170° C.

As illustrated in FIG. 9A, the insulating layer IL4 is formed on the insulating layer IL2 and the sacrificing layer SL. For example, the insulating layer IL4 is formed by applying an insulating resin such as polyimide and then curing the insulating resin.

Next, an opening OP2 is formed in the insulating layer IL4 to expose the sacrificing layer SL. Subsequently, the sacrificing layer SL is heated to liquefy the sacrificing layer SL. The liquefied sacrificing layer SL can be suctioned (or otherwise removed) through the opening OP2, as illustrated in FIG. 9B, the trench T1 is cleared again. Alternatively, the sacrificing layer SL may be gasified through heating, and the gasified sacrificing layer SL may be suctioned through the opening OP2. Subsequently, the insulating resin can be applied again onto the patterned insulating layer IL4 to close the opening OP2. According to this, the void V is enclosed.

Then, the same processes as illustrated in FIG. 5B to FIG. 6B are performed to obtain the semiconductor device 100.

Here, an operation and an effect according to this embodiment will be described.

When a reverse voltage is applied to the semiconductor device, the $n^-$ type semiconductor region 2 and the p type semiconductor region 3 are depleted. At this time, in the $n^-$ type semiconductor region 2, equipotential lines spread in the X direction and the Y direction along a pn junction plane between the $n^-$ type semiconductor region 2 and the p type semiconductor region 3. However, in the insulator at the periphery of the $n^-$ type semiconductor region 2 and the p type semiconductor region 3, a part of the equipotential lines are curved toward the cathode electrode 31 or the anode electrode 32. When the thickness of the insulator is small, the equipotential lines also are curved in the vicinity of the outer periphery of the $n^-$ type semiconductor region 2. When the equipotential lines are curved in the $n^-$ type semiconductor region 2, an intensity of an electric field at a portion in which the equipotential lines are curved increases, and thus a breakdown voltage of the semiconductor device decreases. Accordingly, it is desirable that the insulator be thick so as to maintain the breakdown voltage of the semiconductor device.

On the other hand, the required thickness of the insulator necessary to maintain the breakdown voltage depends on the dielectric constant of the insulator material. The reason for this is as follows. That is, the smaller the dielectric constant of the insulator is, the less the thickness of the insulator that is required to maintain the breakdown voltage is. The lower the dielectric constant of the insulator material, the denser the equipotential lines will be in the insulator, and thus curvature of the equipotential lines in the insulator will increase.

In the semiconductor device 100, the void V is formed at the periphery of the $n^-$ type semiconductor region 2 and the p type semiconductor region 3. The void V functions as an insulator. In addition, a dielectric constant of the void V is approximately equal to the dielectric constant of air or vacuum, and is thus smaller than a dielectric constant of insulating materials such as silicon oxide and silicon nitride. According to this, the thickness of the insulator can be made smaller in comparison to a case where an insulator formed from silicon oxide, silicon nitride, or the like is provided at the periphery of the $n^-$ type semiconductor region 2 and the p type semiconductor region 3 instead of the void V being formed at the periphery of the $n^-$ type semiconductor region 2 and the p type semiconductor region 3.

Therefore, according to this embodiment, the thickness of the insulator at the periphery of the $n^-$ type semiconductor region 2 and the p type semiconductor region 3 is made to be smaller, and thus it is possible to realize a reduction in size of the semiconductor device (e.g., a reduction in die size or planar area more generally).

In addition, in the semiconductor device according to this embodiment, the insulating portions 11 and 12 are provided at portions of the $n^+$ type semiconductor region 1, the $n^-$ type semiconductor region 2, and the p type semiconductor region 3 which face or border the void V. Since these insulating portions are provided, it is possible to suppress occurrence of a leakage current and a decrease in a breakdown voltage of the semiconductor device due interactions between the semiconductor regions and the void V space that might otherwise occur.

In addition, in the semiconductor device according to this embodiment, the insulating portion 20 covers the void V, and a part of the anode electrode 32 is provided above the void V. Since a part of the anode electrode 32 is provided above that void V, this particular part of the anode electrode 32 functions as a field plate electrode to suppress concentration of electrical fields at an end of the pn junction plane between the $n^-$ type semiconductor region 2 and the p type semiconductor region 3. According to this, it is possible to improve the breakdown voltage of the semiconductor device.

Since the $n^-$ type semiconductor region 5 is provided at the periphery of the insulating portion 13, an end of the insulating portion 20 can supported by the insulating portion 12 and the $n^-$ type semiconductor region 5, and thus it is possible to improve a mechanical strength of the semiconductor device 100.

In addition, in the semiconductor device 100, the conductive layer 41, which is electrically connected to the anode electrode 32 and the $n^-$ type semiconductor region 5, is provided. As such, even when a reverse voltage is being applied to the semiconductor device 100 and thus a current is not flowing to the $n^-$ type semiconductor region 2, a minute (small) current can flow in the conductive layer 41, and an electric potential distribution will thus be generated in the conductive layer 41. At this time, equipotential lines at the periphery of the $n^-$ type semiconductor region 2 and the p type semiconductor region 3 will be distributed in accordance with the electric potential distribution in the conductive layer 41. As a result, concentration of the electric field concentrate on the end of the pn junction plane will be suppressed, and thus it is possible to improve the breakdown voltage of the semiconductor device 100.

Furthermore, it is desirable that a width (along the X-direction in figures or a radial direction of the device more generally) of the void V be 5 μm or greater so as to suppress entrance of electric charges from an outer side of the semiconductor device 100 and to suppress a variation in the breakdown voltage. More preferably, the width of the trench T1 is 0.5 times to 1.5 times as large as the thickness of the $n^-$ type semiconductor region 2 in the Z direction. Here, the width dimension can be considered to represent a dimension in a direction from a part of the $n^-$ type semiconductor layer 2*a* surrounded by the trench T1 toward the $n^-$ type semiconductor region 5.

However, it is often difficult to form the void V with such a wide trench, and then cover the trench with an insulating layer cap without filling in the trench with the insulating layer material. In addition, when forming the void V, there is a possibility that a part of the trench will be filled with the insulating material, and thus the width of the void V will be decreased.

In contrast, in the manufacturing method according to this embodiment, for example, as illustrated in FIG. 5A, the large trench T1 is formed below a plurality of small openings OP1, and the void V is eventually formed by closing these openings OP1.

Furthermore, description has been given of a case where the semiconductor device 100 is a diode (with reference to FIGS. 1 and 2), but this embodiment is also applicable to other circuit structures such as MOSFETs, IGBTs, and the like.

Figure 10:
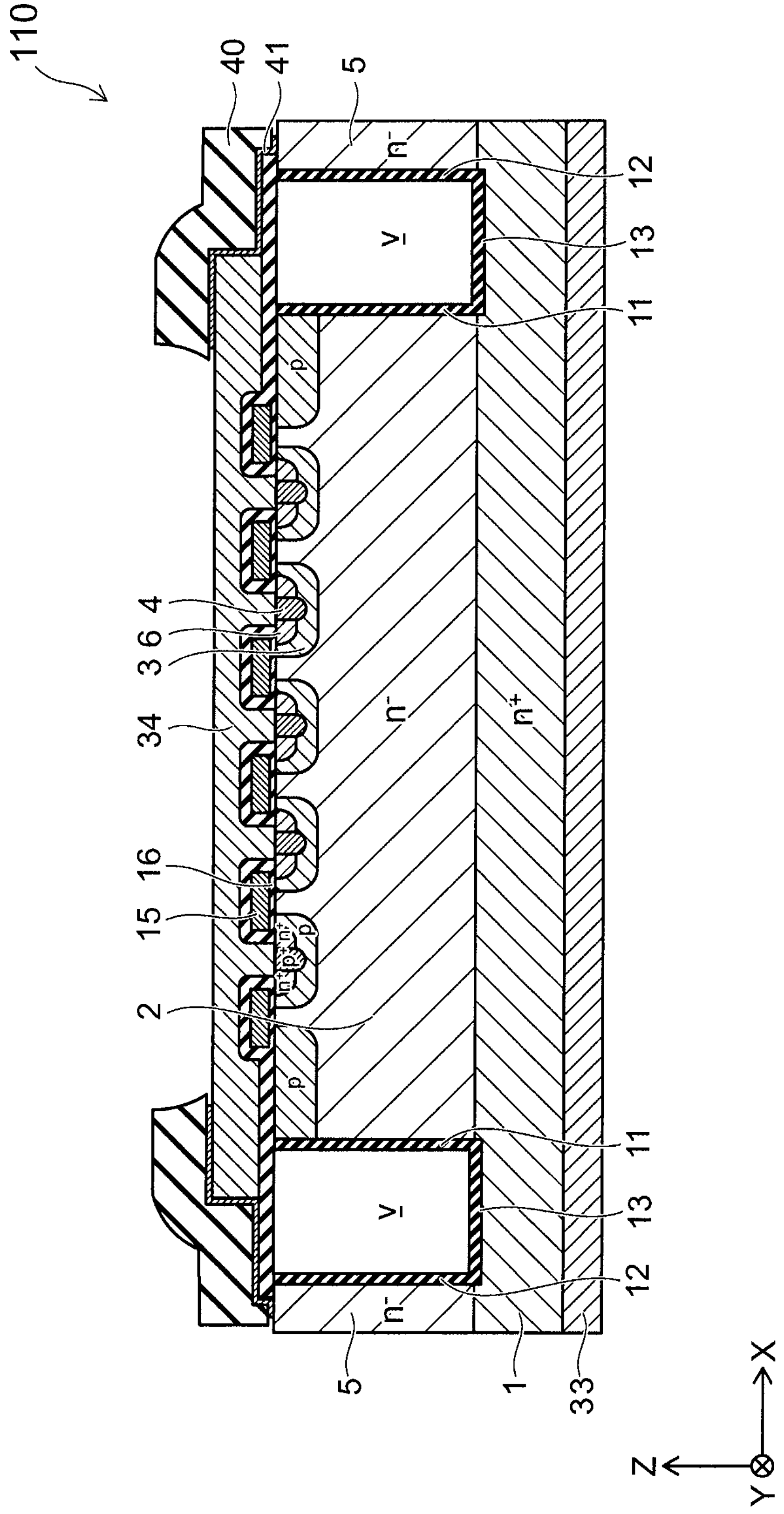
FIG. 10 is a cross-sectional view illustrating a semiconductor device according to a modification example of the first embodiment.

FIG. 10 is a cross-sectional view illustrating a semiconductor device 110 according to a modification example of the first embodiment. The semiconductor device 110 is an MOSFET.

As illustrated in FIG. 10, the semiconductor device 110 further includes an $n^+$ type semiconductor region 6, a gate electrode 15, and a gate insulation layer 16 as compared to the semiconductor device 100. In addition, a drain electrode (first electrode) is provided instead of the cathode electrode 31, and a source electrode 34 (second electrode) is provided instead of the anode electrode 32.

The $n^+$ type semiconductor region 1 is provided on the drain electrode 33, and is electrically connected to the drain electrode 33. The $n^-$ type semiconductor region 2 is provided on the $n^+$ type semiconductor region 1. The p type semiconductor region 3 is provided on the $n^-$ type semiconductor region 2. The $p^+$ type semiconductor region 4 and the $n^+$ type semiconductor region 6 are selectively provided in the p type semiconductor region 3. The gate insulation layer 16 is provided between the gate electrode 15 and the p type semiconductor region 3. The source electrode 34 is provided on the $p^+$ type semiconductor region 4 and the $n^+$ type semiconductor region 6, and is electrically connected to the p type semiconductor region 3, the $p^+$ type semiconductor region 4, and the $n^+$ type semiconductor region 6. The gate insulation layer 16 is provided between the source electrode 34 and the gate electrode 15, and the electrodes 34, 15 are electrically isolated from each other.

In the semiconductor device 110 according to this modification example, the void V is still provided at the periphery of the $n^-$ type semiconductor region 2 and the p type semiconductor region 3. Accordingly, as was the case with the semiconductor device 100, it is possible to realize a reduction in size (width dimension) of the semiconductor device 110.

That is, with regard to semiconductor devices other than a diode (device 100), since the void V is provided at the periphery of the semiconductor region in which a pn junction plane is formed, it is possible to realize a reduction in size of the semiconductor device.

In the example illustrated in FIG. 10, the semiconductor device 110 has a planar gate structure in which the gate electrode 15 is provided on the semiconductor region via the gate insulation layer 16. However, this disclosure is not limited to this example, and the semiconductor device 110 may instead or also have a trench-type gate structure in which the gate electrode 15 extends into in the semiconductor region with the gate insulation layer 16 interposed between electrode material and semiconductor material.

In addition, the semiconductor device 110 is to be an IGBT, the semiconductor device 110 will further include a $p^+$ type semiconductor region that is provided below the $n^+$ type semiconductor region 1. In this case, the drain electrode 33 functions as a collector electrode, and the source electrode 34 functions as an emitter electrode.

Second Embodiment

Figure 11:
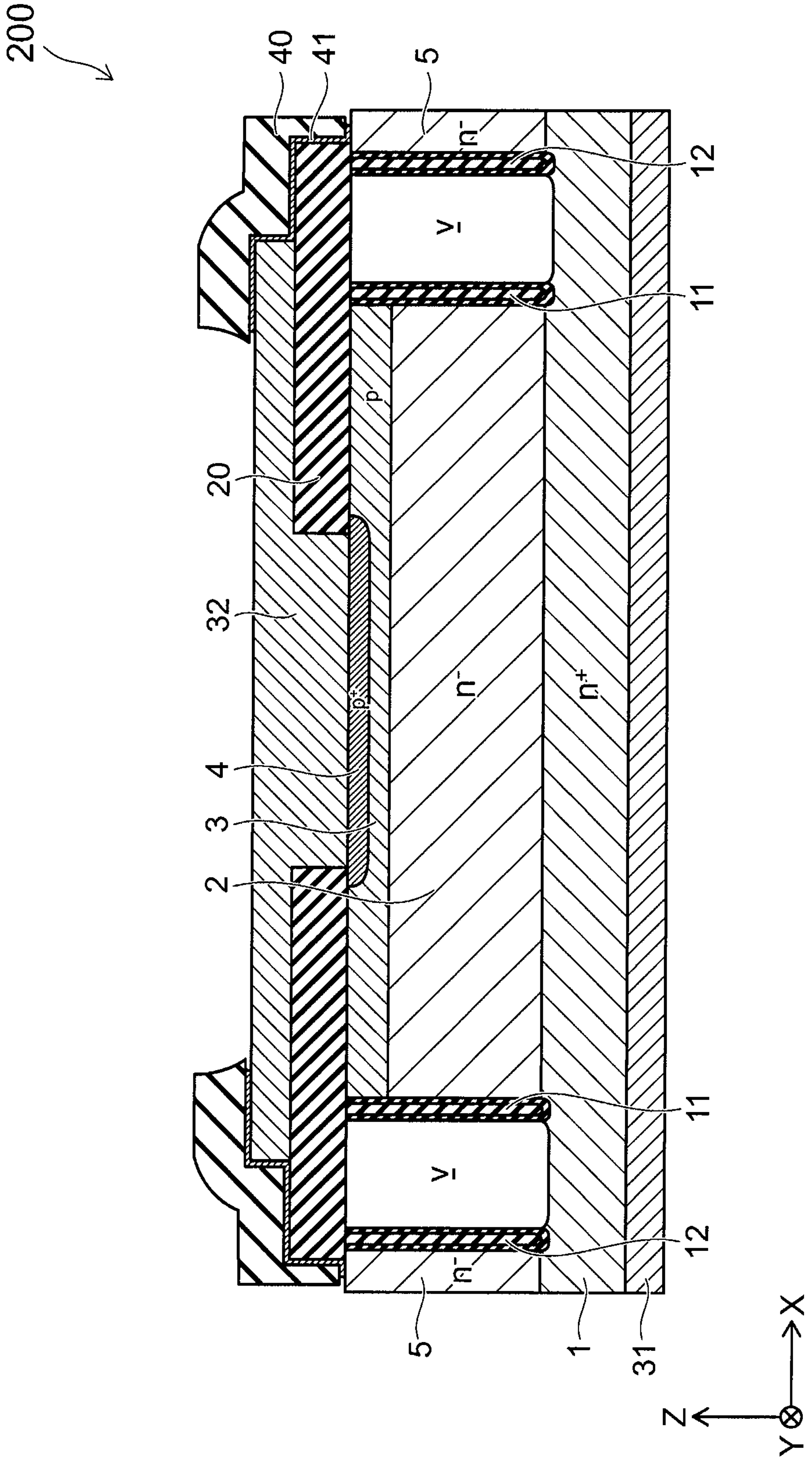
FIG. 11 is a cross-sectional view illustrating a semiconductor device according to a second embodiment.

FIG. 11 is a cross-sectional view illustrating a semiconductor device 200 according to a second embodiment.

Figure 12:
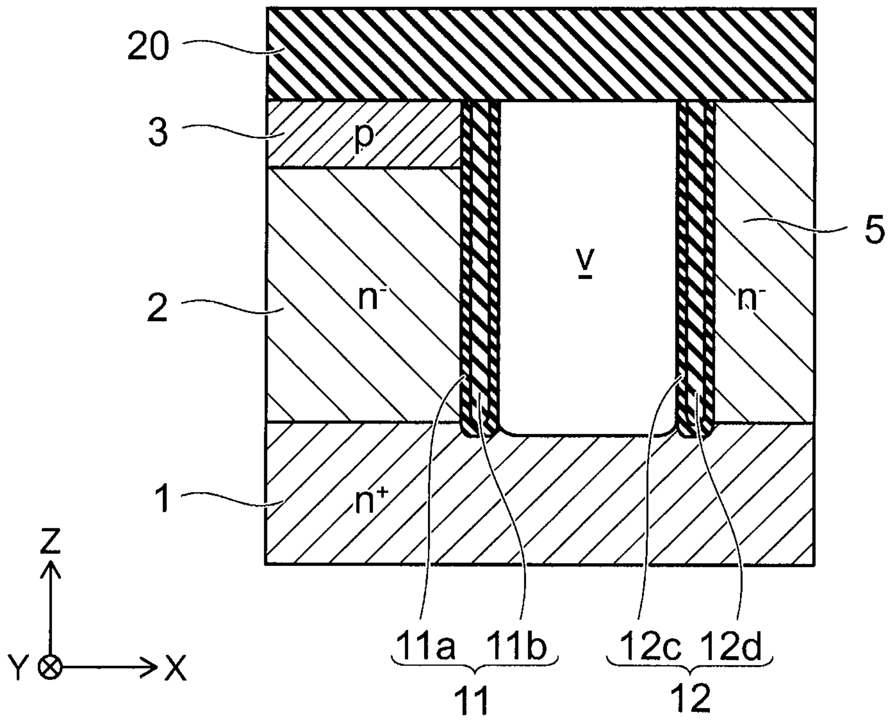
FIG. 12 is an enlarged cross-sectional view of the vicinity of insulating portions provided in the semiconductor device according to the second embodiment.

FIG. 12 is an enlarged cross-sectional view of the vicinity of insulating portions 11 and 12 provided in the semiconductor device 200.

The semiconductor device 200 and the semiconductor device 100 are different in a structure of the insulating portion 11 and the insulating portion 12.

As illustrated in FIG. 11, the insulating portion 11 is provided at the periphery of the $n^-$ type semiconductor region 2 and the p type semiconductor region 3, and the insulating portion 12 is provided at the periphery of the insulating portion 11 on the other side of the void V.

As illustrated in FIG. 12, the insulating portion 11 here includes a first insulating portion 11*a* and a second insulating portion 11*b*. The insulating portion 12 includes a third insulating portion 12*c* and a fourth insulating portion 12*d*.

The first insulating portion 11*a* has a U-shape, and the second insulating portion 11*b* is provided inside the first insulating portion 11*a*.

That is, a part of the first insulating portion 11*a* is provided at the periphery of the $n^-$ type semiconductor region 2 and the p type semiconductor region 3, and the second insulating portion 11*b* is provided at the periphery of the part of the first insulating portion 11*a*. In addition, the other part of the first insulating portion 11*a* is provided at the periphery of the second insulating portion 11*b*.

With regard to the insulating portion 12, a part of the third insulating portion 12*c* is provided at the periphery of the insulating portion 11 on the other side of the void V. The fourth insulating portion 12*d* is provided at the periphery of the part of the third insulating portion 12*c*, and the other part of the third insulating portion 12*c* is provided at the periphery of the fourth insulating portion 12*d*. In addition, the $n^-$ type semiconductor region 5 is provided at the periphery of the other part of the third insulating portion 12*c*. The n− type semiconductor region 5 may be referred to a remnant semiconductor region 5 in some context.

As an example, the first insulating portion 11*a* and the third insulating portion 12*c* are formed through thermal oxidation of a semiconductor material, and the second insulating portion 11*b* and the fourth insulating portion 12*d* are formed by a CVD method. According to this, the first insulating portion 11*a* and the third insulating portion 12*c* are more densely formed than the second insulating portion 11*b* and the fourth insulating portion 12*d*.

That is, since the first insulating portion 11*a* and the second insulating portion 11*b* contain a common insulating material, a density of the insulating material at the first insulating portion 11*a* is higher than that of the insulating material at the second insulating portion 11*b*.

In addition, when the third insulating portion 12*c* and the fourth insulating portion 12*d* contain a common insulating material, a density of the insulating material at the third insulating portion 12*c* is higher than that of the insulating material at the fourth insulating portion 12*d*.

Furthermore, in the example illustrated in FIGS. 11 and 12, a part of the $n^+$ type semiconductor region 1 is exposed to the void V (bottom of the void V is $n^+$ type semiconductor region 1). However, as was the case with the semiconductor device 100, an insulating portion 13 may also be provided at a portion the void V facing the $n^+$ type semiconductor region 1.

Here, description will be given of an example of a method of manufacturing the semiconductor device according to the second embodiment.

FIGS. 13A to 14B are process cross-sectional views illustrating the method of manufacturing the semiconductor device 200 according to the second embodiment.

Figure 13A:
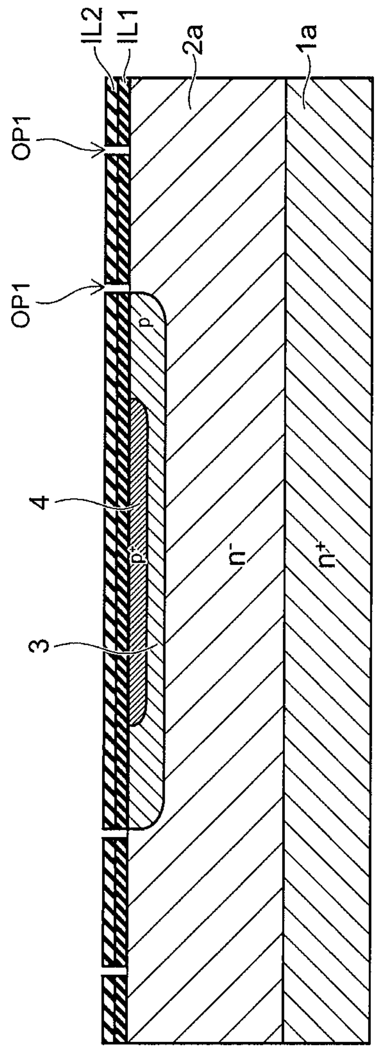
FIGS. 13A and 13B are cross-sectional views illustrating aspects of a method of manufacturing the semiconductor device according to the second embodiment.

First, as was the case with the processes illustrated in FIG. 3A, a p type semiconductor region 3, a $p^+$ type semiconductor region 4, and an insulating layer IL1 are formed on a surface of the $n^-$ type semiconductor layer 2*a*. Next, the insulating layer IL2 and a photoresist layer (not specifically depicted here) are formed on the insulating layer IL1. Subsequently, the insulating layer IL1, the insulating layer IL2, and the photoresist layer are patterned to form openings OP1 as illustrated in FIG. 13A. Each of the openings OP1 is formed in an annular shape at the periphery of the p type semiconductor region 3 and the $p^+$ type semiconductor region 4. In addition, spacing between the openings OP1 is set to be approximately the same as a width of a void V that is to be formed in the final device.

Figure 13B:
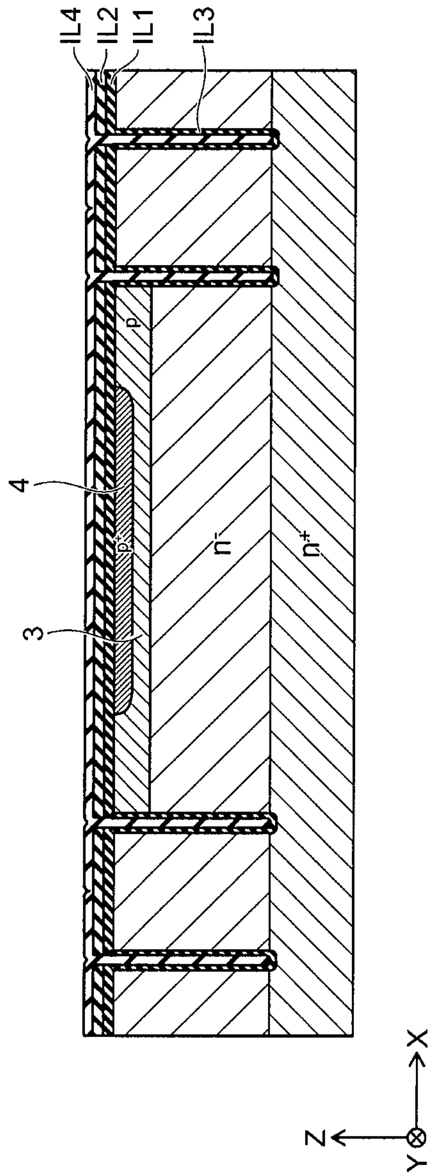

Next, a part of the $n^-$ type semiconductor layer 2*a* and a part of the p type semiconductor region 3 are removed through the opening OP1 by anisotropic etching to form annular trenches (e.g., two continuous ring-shaped trenches spaced from each other in a radial direction which may be referred to as a pair of concentric annular trenches). Subsequently, the semiconductor substrate is thermally oxidized to form an insulating layer IL3 on an inner wall of the trenches. Subsequently, an insulating layer IL4 is formed on the insulating layers IL2 and IL3, and the trenches are filled as illustrated in FIG. 13B. According to this, the insulating portions 11 and 12, which surround the part of the $n^-$ type semiconductor layer 2*a* and the p type semiconductor region 3, are formed.

Figures 14A, 14B:
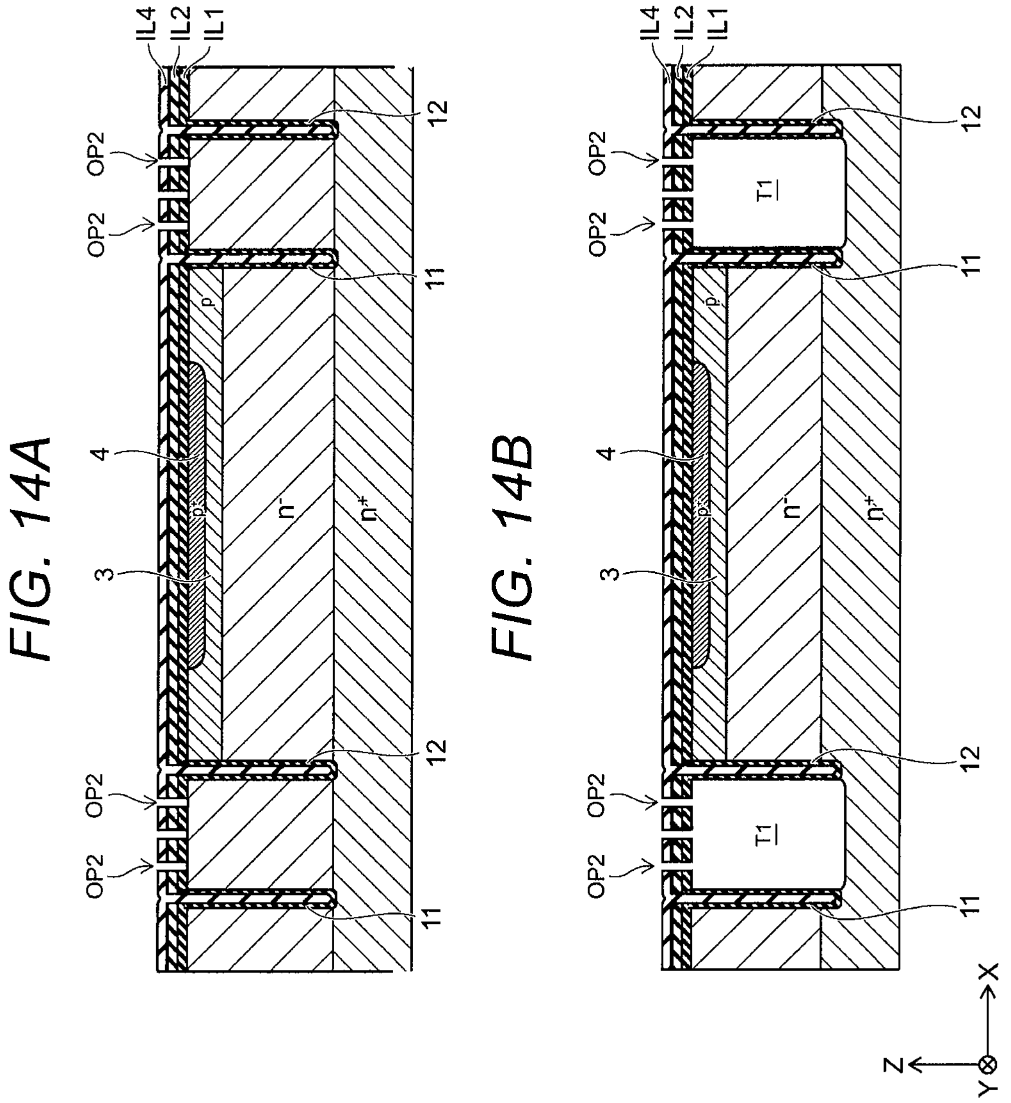
FIGS. 14A and 14B are cross-sectional views illustrating aspects of the method of manufacturing the semiconductor device according to the second embodiment.

Next, the insulating layers IL1, IL2, and IL4 are patterned to form a plurality of openings OP2 as illustrated in FIG. 14A. According to this process, the $n^-$ type semiconductor layer 2*a* between the insulating portion 11 and the insulating portion 12 is exposed through the openings OP2. For example, as was the case with the openings OP1 illustrated in FIG. 4, the openings OP2 are formed to be arranged in a circumferential direction and may consist of an array of disconnected dots, dashes, or other non-continuous structures when viewed from a planar direction (compare FIG. 4).

Next, the $n^-$ type semiconductor layer 2*a* between the insulating portion 11 and the insulating portion 12 is removed through the openings OP2 to form a trench T1. Here, isotropic etching is used for removal of the $n^-$ type semiconductor layer 2*a*. At this time, the insulating portions 11 and 12 functions as a masking material that suppresses etching in an X-Y in-plane direction beyond the intended void V position.

After forming the trench T1, the semiconductor substrate may optionally be thermally oxidized to form an insulating layer at the bottom of the trench T1.

Next, an insulating layer, which closes the openings OP2, can be formed on the insulating layer IL4 by using a CVD method. At this time, the insulating layer is formed not to fill the trench T1. According to this process, the void V is formed. In some context, the void V may be referred to as void space V.

Then, the same processes as illustrated in FIG. 5B to FIG. 6B are performed to obtain a semiconductor device 200.

Even in the semiconductor device 200, as was the case with the first embodiment, the void V is formed at the periphery of the $n^-$ type semiconductor region 2 and the p type semiconductor region 3.

According to this, as was the case with the first embodiment, the thickness of the insulator at the periphery of the $n^-$ type semiconductor region 2 and the p type semiconductor region 3 is made smaller (since the void V has very low dielectric constant), and thus it is possible to realize a reduction in size of the semiconductor device.

Therefore, according to the method of manufacturing the semiconductor device of this second embodiment, a deviation in the amount of etching to a lateral side when forming the trench T1 is further reduced in comparison to the method of manufacturing the semiconductor device according to the first embodiment since the insulating portions 12 and 11 function as masking materials which limit the lateral spread of the trench during the isotropic etching process, and thus it is possible to reduce a deviation in a width of the trench T1.

Furthermore, as was the case with the first embodiment, this second embodiment is also applicable to other semiconductor devices such as an MOSFET and an IGBT and is not just limited to diodes. That is, in the semiconductor device 110 illustrated in FIG. 10, the insulating portions 11 and 12, which have the structure illustrated in FIG. 12, may be provided.

For example, in the above-described embodiments, a relative magnitude of an impurity concentration between the respective semiconductor regions can be confirmed by using a scanning electrostatic capacitance microscope (SCM). Furthermore, a carrier concentration in the respective semiconductor regions can be regarded as the same thing as the concentration of impurities which are activated in the respective semiconductor regions. Accordingly, a relative magnitude of the carrier concentration between the respective semiconductor regions can also be confirmed by using the SCM.

In addition, for example, the impurity concentration in the respective semiconductor regions can be measured by a secondary ion mass spectrometry (SIMS).

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the example embodiments described herein may be made without departing from the spirit of the present disclosure. For example, with regard to specific configurations of respective elements such as the $n^+$ type semiconductor region 1, the $n^-$ type semiconductor region 2, the p type semiconductor region 3, the $p^+$ type semiconductor region 4, the $n^-$ type semiconductor region 5, the $n^+$ type semiconductor region 6, the insulating portions 11 to 13, the gate electrode 15, the gate insulation layer 16, the insulating portion 20, the cathode electrode 31, the anode electrode 32, the drain electrode 33, the source electrode 34, the insulating portion 40, the conductive layer 41, and the void V, the configurations may be appropriately selected from a known technology by those skilled in the art. The accompanying claims and their equivalents are intended to cover such forms or modifications as would fall within the scope and spirit of the inventions. In addition, the above-described embodiments can be executed in combination thereof.

What is claimed is:

1. A semiconductor device, comprising:

a first electrode having a first surface;

a first semiconductor region of a first conductivity type on the first surface of the first electrode;

a second semiconductor region of the first conductivity type on a central portion of the first semiconductor region, and having a first conductivity type carrier concentration that is less than a first conductivity type carrier concentration of the first semiconductor region;

a third semiconductor region of a second conductivity type on the second semiconductor region;

a first insulating portion on an outer peripheral surface of the second semiconductor region and an outer peripheral surface of the third semiconductor region;

a second insulating portion spaced from the first insulating portion in a lateral direction parallel to the first surface and extending outwardly of the central portion of the first semiconductor region, a void space being disposed between the first and second insulating portions in the lateral direction;

a third insulating portion on the third semiconductor region and spanning across the void space in the lateral direction to cover the void space; and a second electrode on the third semiconductor region and the third insulating portion, and electrically connected to the third semiconductor region, wherein the first insulating portion and the second insulating portion are directly adjacent the void and have a constant thickness, in the lateral direction, from a level of the void space closest to first electrode to a level of the void space closest to the second electrode.

2. The semiconductor device according to claim 1, wherein a part of the second electrode is above the void space in a direction orthogonal to the first surface such that the third insulating portion is between the second electrode and the void space.

3. The semiconductor device according to claim 1, further comprising:

a remnant semiconductor region that is beyond the central portion of the first semiconductor region in the lateral direction and is directly contacting an outer peripheral surface of the second insulating portion, wherein the third insulating portion extends in the lateral direction beyond the outer peripheral surface of the second insulating portion above the remnant semiconductor region in a direction orthogonal to the first surface.

4. The semiconductor device according to claim 3, further comprising:

a conductive layer on the remnant semiconductor region, the third insulating portion, and the second electrode; and a fourth insulating portion on the conductive layer and an outer peripheral portion of the second electrode, wherein:

the conductive layer electrically connects the second electrode and the remnant semiconductor region, and electrical resistance of the conductive layer is higher than the electrical resistance of the remnant semiconductor region.

5. The semiconductor device according to claim 1, further comprising:

a fourth semiconductor region of the second conductivity type on the third semiconductor region and contacting the second electrode.

6. The semiconductor device according to claim 1, further comprising:

a fourth insulating portion on the first semiconductor region between the first and second insulating portions spanning across a lower surface of the void space.

7. The semiconductor device according to claim 1, wherein:

the first insulating portion comprises a first part and a second part, the first part covering a bottom surface and lateral surfaces of the second part of the first insulating portion, and the second insulating portion comprises a first part and a second part, the first part covering a bottom surface and lateral surfaces of the second part of the second insulating portion.

8. The semiconductor device according to claim 7, wherein:

the first parts of the first and second insulating portions comprise material formed by thermal oxidation of semiconductor material, and the second parts of the first and second insulating portions comprise material formed by chemical vapor deposition.

9. The semiconductor device according to claim 1, further comprising:

a gate electrode on the second semiconductor region via a gate insulating film.

10. The semiconductor device according to claim 9, wherein the gate electrode is a planar type gate electrode.

11. A semiconductor device, comprising:

a first semiconductor region of a first conductivity type and having first surface;

a second semiconductor region of the first conductivity type above a central portion of the first surface in a first direction orthogonal to the first surface, the second semiconductor region having a first conductivity type carrier concentration that is less than a first conductivity type carrier concentration of the first semiconductor region;

a third semiconductor region of a second conductivity type on the second semiconductor region;

a fourth semiconductor region above an outer peripheral portion of the first surface in the first direction;

a void space surrounding the second and third semiconductor regions, the void space being between the second and fourth semiconductor regions and the third and fourth semiconductor regions in a lateral direction parallel to the first surface; and a first insulating layer above the void space in the first direction and spanning in the lateral direction from the third semiconductor region to the fourth semiconductor region, wherein:

a first wall of the void space comprises a first insulating material covering outer peripheral surfaces of the second and third semiconductor regions, and extending in the first direction from the first semiconductor region to the first insulating layer, a second wall of the void space comprises the first insulating material covering a lateral surface of the fourth semiconductor region facing the void space, and extending in the first direction from the first semiconductor region to the first insulating layer, and the first wall and the second wall have a constant thickness of first insulating material, in the lateral direction, from a lowermost level of the void space to an uppermost level of the void space.

12. The semiconductor device of claim 11, further comprising:

a first electrode on a second surface of the first semiconductor region that is opposite the first surface;

a fifth semiconductor region of the second conductivity type on the third semiconductor region; and a second electrode having a first portion contacting the fifth semiconductor region and a second portion above the void space in the first direction on the first insulating layer.

13. The semiconductor device of claim 12, further comprising:

a gate electrode disposed on the second semiconductor region via a gate insulating film.

14. The semiconductor device of claim 12, further comprising:

a conductive layer on the fourth semiconductor region, the first insulating layer, and the second electrode; and a second insulating film on the conductive layer, wherein:

the conductive layer electrically connects the second electrode and the fourth semiconductor region, and electrical resistance of the conductive layer is higher than the electrical resistance of the fourth semiconductor region.

15. The semiconductor device of claim 11, wherein the first insulating material comprises a first part and a second part, the first part covering a bottom surface and lateral surfaces of the second part.

16. The semiconductor device of claim 15, wherein:

the first part comprises material formed by thermal oxidation of semiconductor material, and the second part comprises material formed by chemical vapor deposition.

17. The semiconductor device of claim 11, wherein a bottom surface of the void space is covered with the first insulating material.

18. A method, comprising:

forming a first semiconductor region of a first conductivity type having a first surface;

forming a second semiconductor region of the first conductivity type above a central portion of the first surface in a first direction orthogonal to the first surface, the second semiconductor region having a first conductivity type carrier concentration that is less than a first conductivity type carrier concentration of the first semiconductor region;

forming a third semiconductor region of a second conductivity type on the second semiconductor region in the first direction;

forming a fourth semiconductor region above an outer peripheral portion of the first surface in the first direction;

forming a void space surrounding the second and third semiconductor regions, the void space being between the second and fourth semiconductor regions and the third and fourth semiconductor regions in a lateral direction parallel to the first surface; and forming a first insulating layer above the void space in the first direction and spanning in the lateral direction from the third semiconductor region to the fourth semiconductor region, wherein:

a first wall of the void space is formed of a first insulating material that covers outer peripheral surfaces of the second and third semiconductor regions and extends in the first direction from the first semiconductor region to the first insulating layer, and a second wall of the void space is formed of the first insulating material that covers a lateral surface of the fourth semiconductor region facing the void space and extends in the first direction from the first semiconductor region to the first insulating layer, wherein the first wall and the second wall have a constant thickness of first insulating material, in the lateral direction, from a lowermost level of the void space to an uppermost level of the void space.

19. The method of claim 18, wherein forming the void space comprises:

forming a plurality of openings in an insulating mask layer disposed on the second semiconductor region, the plurality of openings surrounding the central portion of the first surface;

performing an isotropic etch process on the second semiconductor region through the plurality openings; and forming an insulating material to close the plurality of openings in the insulating mask after performing the isotropic etch process.

20. The method of claim 19, wherein forming the void space further comprises:

anisotropically etching a concentric pair of annular trenches into the second semiconductor region;

thermally oxidizing sidewalls of the concentric pair of annular trenches; and filling the concentric pair of annular trenches with an insulating material using a vapor deposition process after thermally oxidizing the sidewalls, then depositing the insulating mask layer in which the plurality of openings is to be subsequently formed.

* * * * *